(12) United States Patent
Nakatani et al.

(10) Patent No.: US 8,623,681 B2
(45) Date of Patent: Jan. 7, 2014

(54) THIN FILM TRANSISTOR SUBSTRATE, METHOD FOR MANUFACTURING THE SAME, AND LIQUID CRYSTAL DISPLAY PANEL

(75) Inventors: Yoshiki Nakatani, Osaka (JP); Yuhichi Saitoh, Osaka (JP); Tetsuya Okamoto, Osaka (JP); Yohsuke Kanzaki, Osaka (JP); Yudai Takanishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/808,375

(22) PCT Filed: Jul. 1, 2011

(86) PCT No.: PCT/JP2011/003779
§ 371 (c)(1),
(2), (4) Date: Feb. 6, 2013

(87) PCT Pub. No.: WO2012/004958
PCT Pub. Date: Jan. 12, 2012

(65) Prior Publication Data
US 2013/0214272 A1    Aug. 22, 2013

(30) Foreign Application Priority Data

Jul. 9, 2010   (JP) ................................ 2010-157149

(51) Int. Cl.
*H01L 21/00*    (2006.01)
(52) U.S. Cl.
USPC ......................................................... 438/30
(58) Field of Classification Search
USPC ......................................................... 438/30
See application file for complete search history.

(56) References Cited

U.S. PATENT DOCUMENTS

| | | |
|---|---|---|
| 2001/0041394 A1 | 11/2001 | Park et al. |
| 2002/0197539 A1 | 12/2002 | Park et al. |
| 2004/0135147 A1 | 7/2004 | Kim et al. |
| 2004/0238825 A1 | 12/2004 | Lim et al. |
| 2006/0001604 A1 | 1/2006 | Kim et al. |
| 2006/0258059 A1 | 11/2006 | Seo et al. |
| 2008/0090404 A1 | 4/2008 | Lim et al. |
| 2009/0096105 A1 | 4/2009 | Lim et al. |
| 2010/0096176 A1 | 4/2010 | Lim et al. |
| 2010/0096654 A1 | 4/2010 | Godo |

FOREIGN PATENT DOCUMENTS

| | | |
|---|---|---|
| JP | 2001-319876 A | 11/2001 |
| JP | 2006-269696 A | 10/2006 |
| JP | 2007-522670 A | 8/2007 |
| JP | 2009-182343 A | 8/2009 |
| JP | 2010-44419 A | 2/2010 |
| JP | 2010-117710 A | 5/2010 |

OTHER PUBLICATIONS

Official Communication issued in International Patent Application No. PCT/JP2011/003779, mailed on Oct. 4, 2011.

*Primary Examiner* — Anthony Ho
(74) *Attorney, Agent, or Firm* — Keating & Bennett, LLP

(57) ABSTRACT

An auxiliary capacitor (6a) includes a capacitor line (11ba), a gate insulating film (12) provided so as to cover the capacitor line (11ba), a semiconductor layer (13b) provided on the gate insulating film (12) so as to overlap with the capacitor line (11b), and a drain electrode (14ba) provided on the semiconductor layer (13b) and connected to a pixel electrode (16a). The semiconductor layer (13b) made of an oxide semiconductor and the pixel electrode (16a) made of an oxide conductor contact each other.

2 Claims, 12 Drawing Sheets

FIG.5
(a)
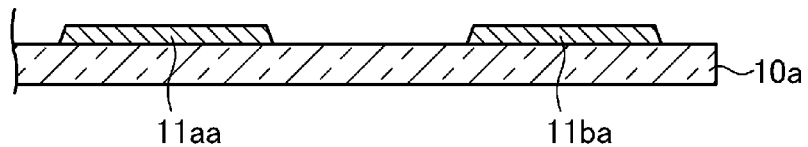
(b)
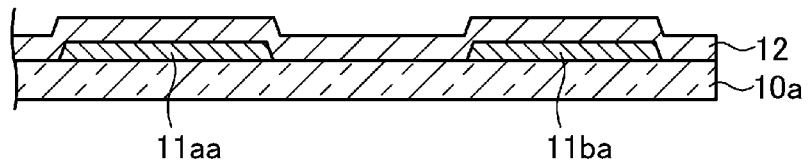
(c)
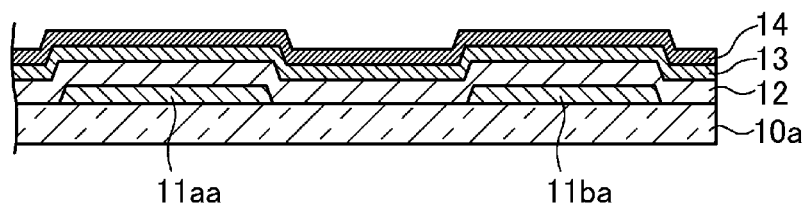
(d)
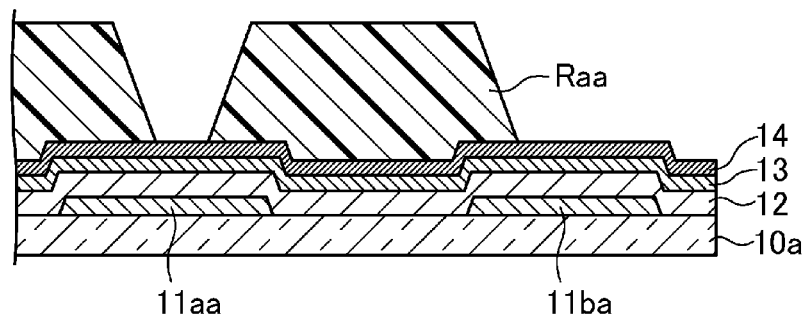

FIG.7
(a)
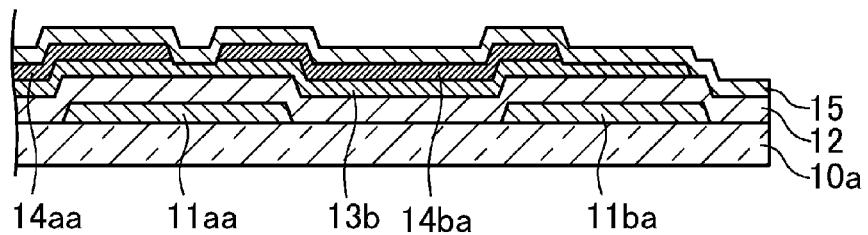
(b)
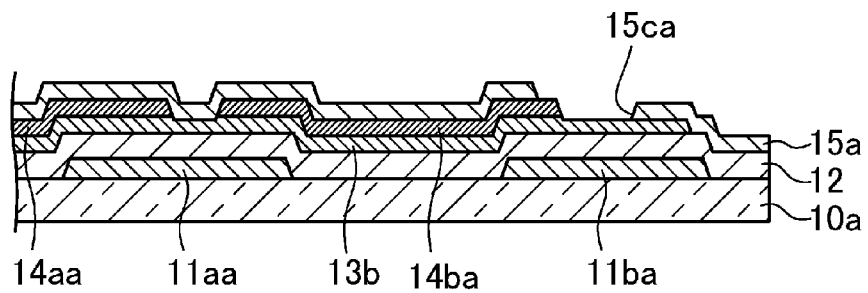
(c)
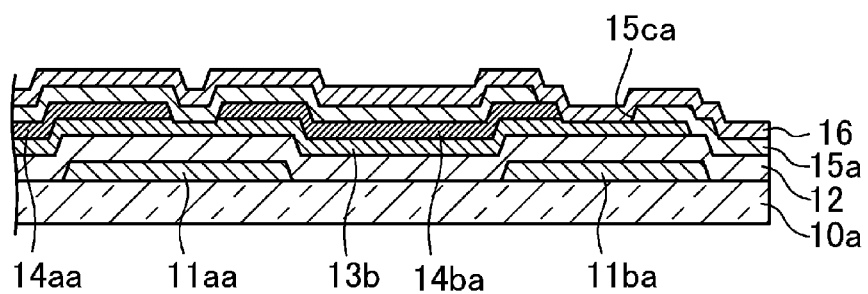

FIG.9
(a)
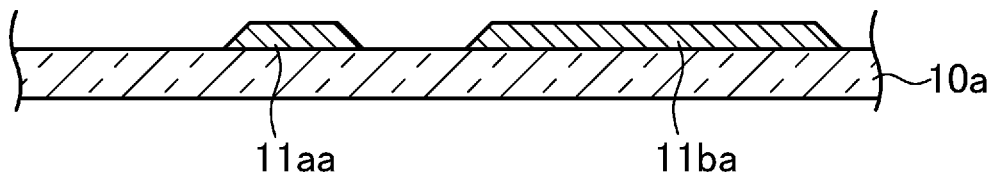
(b)
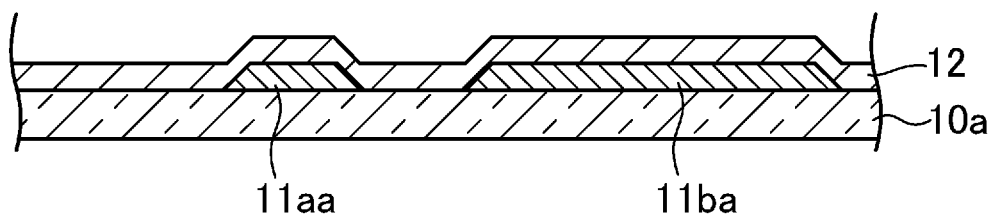
(c)
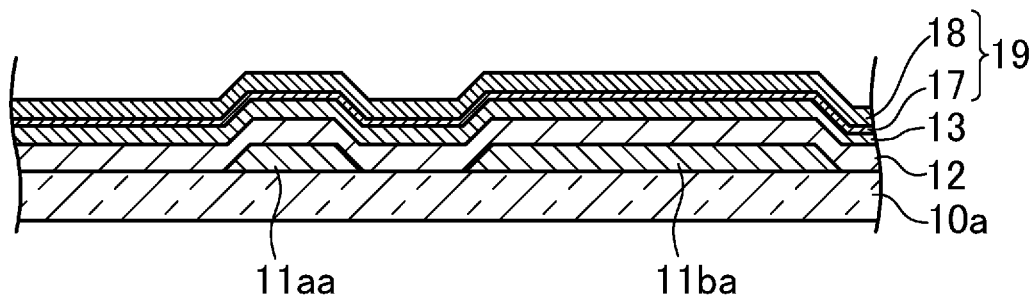
(d)
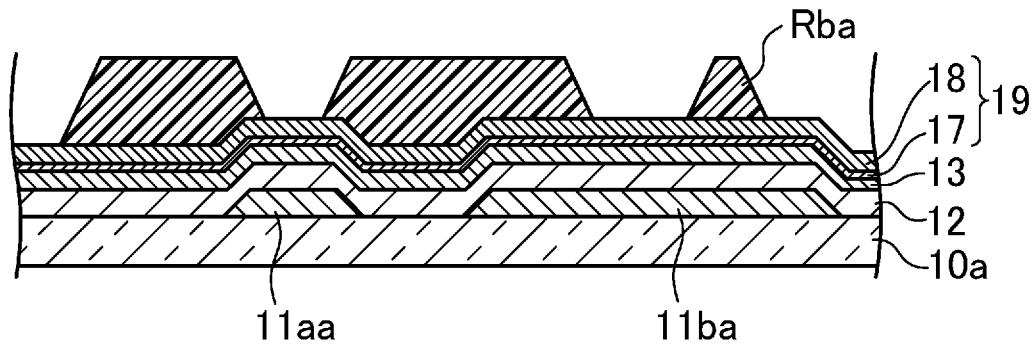

FIG.11
(a)
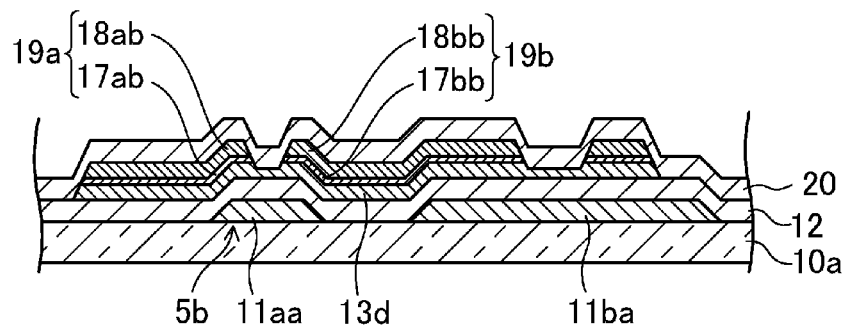
(b)
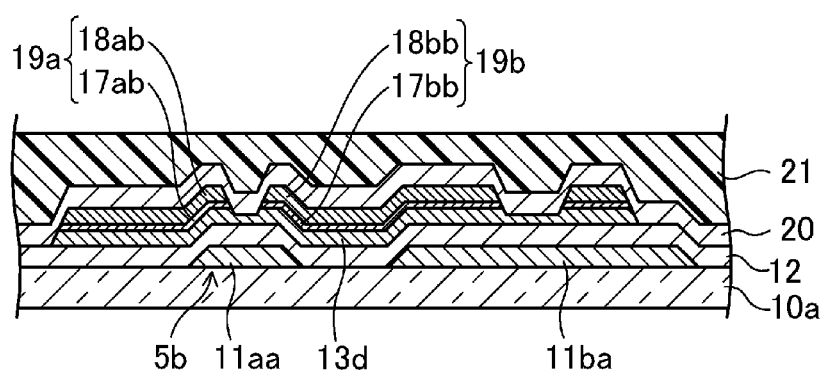
(c)
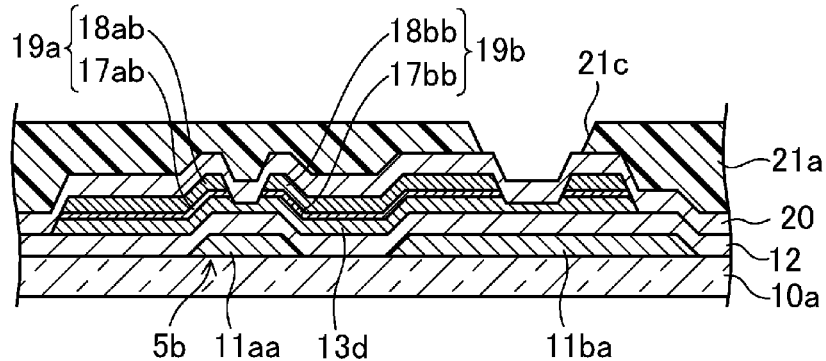

THIN FILM TRANSISTOR SUBSTRATE, METHOD FOR MANUFACTURING THE SAME, AND LIQUID CRYSTAL DISPLAY PANEL

TECHNICAL FIELD

The present invention relates to a thin film transistor substrate, a manufacturing method thereof, and a liquid crystal display panel. In particular, the present invention relates to a thin film transistor substrate including auxiliary capacitors, a manufacturing method thereof, and a liquid crystal display panel.

BACKGROUND ART

An active matrix liquid crystal display panel includes a TFT substrate in which, e.g., a thin film transistor (hereinafter referred to as a "TFT") is provided as a switching element at each pixel which is the minimum unit of an image, a counter substrate arranged so as to face the TFT substrate, and a liquid crystal layer sealed between the foregoing substrates. In the TFT substrate, an auxiliary capacitor is provided at each pixel in order to stably retain an electric charge on part of the liquid crystal layer corresponding to each pixel, i.e., a liquid crystal capacitor. The auxiliary capacitor includes, e.g., a capacitor line provided on the substrate, a gate insulating film provided so as to cover the capacitor line, and a capacitor electrode (e.g., a drain electrode of the TFT) provided on the gate insulating film so as to overlap with the capacitor line.

For example, Patent Document 1 discloses a method for manufacturing a TFT substrate. In such a method, a gate insulating film, a semiconductor layer (film forming the semiconductor layer), a contact layer (film forming a contact layer pattern), and a conductive layer are vapor-deposited in this order so as to cover gate lines, gate electrodes, and storage electrodes which are formed on an insulating substrate. After a photosensitive film is formed on the conductive layer by two times of light exposure, the semiconductor layer (film forming the semiconductor layer), the contact layer (film forming the contact layer pattern), and the conductive layer are etched in two steps by using the photosensitive film. Then, data lines, source electrodes, the semiconductor layer, the contact layer pattern, drain electrodes, and a storage capacitor conductive pattern are formed.

CITATION LIST

Patent Document

PATENT DOCUMENT 1: Japanese Patent Publication No. 2001-319876

SUMMARY OF THE INVENTION

Technical Problem

In the TFT substrate manufactured by the manufacturing method disclosed in Patent Document 1, a storage capacitor corresponding to the auxiliary capacitor has a multilayer structure of the storage electrode, the gate insulating film, a storage capacitor semiconductor layer, a storage capacitor contact layer pattern, and the storage capacitor conductive pattern. In a TFT substrate manufacturing method in which a step of forming a semiconductor layer, source electrodes, and drain electrodes by using an identical photo mask is simplified, the semiconductor layer is, as in the manufacturing method disclosed in Patent Document 1, positioned below the source electrodes and the drain electrodes, and therefore the semiconductor layer is stacked below a capacitor electrode (drain electrode) serving as an auxiliary capacitor. In such a case, not only a gate insulating film but also the semiconductor layer function as dielectric layers in an auxiliary capacitor having a multilayer structure of a capacitor line, the gate insulating film, the semiconductor layer, and the drain electrode. Thus, a change in electrical capacitance due to a metal oxide semiconductor (MOS) structure occurs between the gate insulating film and the semiconductor layer, and a change in electrical capacitance due to a schottky structure occurs between the semiconductor layer and the drain electrode. For such reasons, in a liquid crystal display panel configured to control the potential of pixel electrodes through auxiliary capacitors, the potential of the pixel electrodes is not controlled at a predetermined potential, resulting in occurrence of display defects such as flicker.

The present invention has been made in view of the foregoing, and it is an objective of the present invention to reduce a change in electrical capacitance of an auxiliary capacitor due to a semiconductor layer.

Solution to the Problem

In order to accomplish the foregoing objective, the present invention is configured such that a semiconductor layer made of an oxide semiconductor and a pixel electrode made of an oxide conductor contact each other.

Specifically, a thin film transistor substrate of the present invention includes a plurality of pixel electrodes provided in a matrix; a plurality of thin film transistors each provided for a corresponding one of the pixel electrodes and connected to the corresponding one of the pixel electrodes; and a plurality of auxiliary capacitors each provided for a corresponding one of the pixel electrodes. Each of the thin film transistors includes a gate electrode provided on a substrate, a gate insulating film provided so as to cover the gate electrode, a semiconductor layer provided on the gate insulating film and having a channel region such that the channel region and the gate electrode overlap with each other, and source and drain electrodes provided on the semiconductor layer and arranged apart from each other with the channel region being interposed therebetween, the channel region being exposed through the source and drain electrodes. Each of the auxiliary capacitors includes a capacitor line made of a material identical to that of the gate electrode and provided in a layer identical to that of the gate electrode, the gate insulating film provided so as to cover the capacitor line, the semiconductor layer provided on the gate insulating film so as to overlap with the capacitor line, and the drain electrode provided on the semiconductor layer and connected to a corresponding one of the pixel electrodes. The semiconductor layer is made of an oxide semiconductor. Each of the pixel electrodes is made of an oxide conductor. The semiconductor layer and each of the pixel electrodes contact each other.

According to the foregoing configuration, the semiconductor layer of the thin film transistor is made of the oxide semiconductor, and the pixel electrode is made of the oxide conductor. Thus, at each pixel, a band structure in the semiconductor layer and a band structure in the pixel electrode are similar to each other. The semiconductor layer and the pixel electrode contact each other at each pixel. For such a reason, free carriers in each of the pixel electrodes are dispersed into the semiconductor layer and spread to the proximity of an interface between the semiconductor layer and the gate insulating film, and part of the semiconductor layer corresponding to each of the auxiliary capacitors functions as a conductor. Thus, in the auxiliary capacitor having a multilayer structure of the capacitor line, the gate insulating film, the semiconductor layer, and the drain electrode, when voltage is, at each pixel, applied between the capacitor line and the drain electrode, only the gate insulating film is a dielectric layer for retaining an electric charge in the foregoing part, and therefore a change in electrical capacitance can be reduced. Since the change in electrical capacitance can be reduced in each of the auxiliary capacitors each including the semiconductor layer, a change in electrical capacitance of the auxiliary capacitors due to the semiconductor layer can be reduced.

Each of the pixel electrodes may include first and second pixel electrodes provided adjacent to each other with a corresponding one of the thin film transistors being interposed therebetween. The drain electrode may include first and second drain electrodes connected respectively to the first and second pixel electrodes. Each of the auxiliary capacitors may include first and second auxiliary capacitors provided corresponding respectively to the first and second pixel electrodes. The capacitor line may include first and second capacitor lines provided corresponding respectively to the first and second auxiliary capacitors. The first auxiliary capacitor may have the first capacitor line, the gate insulating film provided so as to cover the first capacitor line, the semiconductor layer provided on the gate insulating film so as to overlap with the first capacitor line, and the first drain electrode provided on the semiconductor layer. The second auxiliary capacitor may have the second capacitor line, the gate insulating film provided so as to cover the second capacitor line, the semiconductor layer provided on the gate insulating film so as to overlap with the second capacitor line, and the second drain electrode provided on the semiconductor layer.

According to the foregoing configuration, each of the pixel electrodes includes the first and second pixel electrodes. The drain electrode includes the first and second drain electrodes connected respectively to the first and second pixel electrodes. Each of the auxiliary capacitors includes the first auxiliary capacitor having a multilayer structure of the first capacitor line, the gate insulating film, the semiconductor layer, and the first drain electrode, and the second auxiliary capacitor having a multilayer structure of the second capacitor line, the gate insulating film, the semiconductor layer, and the second drain electrode. Thus, e.g., the thin film transistor substrate having, at each pixel, a structure in which sub-pixels corresponding respectively to the first and second pixel electrodes are different from each other in brightness thereof, i.e., a multi-pixel structure of a light sub-pixel and a dark sub-pixel, is specifically configured. Typically in the thin film transistor substrate having the multi-pixel structure, voltage to be applied between the first capacitor line and the first drain electrode and voltage to be applied between the second capacitor line and the second drain electrode are differentiated from each other in order to differentiate between voltage to be applied to part of the liquid crystal layer corresponding to the light sub-pixel and voltage to be applied to part of the liquid crystal layer corresponding to the dark sub-pixel. In such a case, if the semiconductor layer is simply stacked inside the first and second auxiliary capacitors, the foregoing differentiation may result in a change in electrical capacitance of the first and second auxiliary capacitors. Consequently, there is a possibility that, e.g., a balance with voltage of a common electrode of a counter substrate is disrupted. However, according to the foregoing configuration, the following can be reduced: a change in electrical capacitance of the first auxiliary capacitor due to voltage applied between the first capacitor line and the first drain electrode; and a change in electrical capacitance of the second auxiliary capacitor due to voltage applied between the second capacitor line and the second drain electrode. Thus, in a liquid crystal display panel including the thin film transistor substrate, predetermined voltage is applied to part of the liquid crystal layer corresponding to the light sub-pixel and part of the liquid crystal layer corresponding to the dark sub-pixel in the state in which a balance with voltage of the common electrode of the counter substrate is maintained at each pixel.

A method of the present invention for manufacturing a thin film transistor substrate including a plurality of pixel electrodes provided in a matrix, a plurality of thin film transistors each provided for a corresponding one of the pixel electrodes and connected to the corresponding one of the pixel electrodes, and a plurality of auxiliary capacitors each provided for a corresponding one of the pixel electrodes, in which each of the thin film transistors includes a gate electrode provided on a substrate, a gate insulating film provided so as to cover the gate electrode, a semiconductor layer provided on the gate insulating film and having a channel region such that the channel region and the gate electrode overlap with each other, and source and drain electrodes provided on the semiconductor layer and arranged apart from each other with the channel region being interposed therebetween, the channel region being exposed through the source and drain electrodes, and each of the auxiliary capacitors includes a capacitor line made of a material identical to that of the gate electrode and provided in a layer identical to that of the gate electrode, the gate insulating film provided so as to cover the capacitor line, the semiconductor layer provided on the gate insulating film so as to overlap with the capacitor line, and the drain electrode provided on the semiconductor layer and connected to a corresponding one of the pixel electrodes, the method includes a gate layer formation step of forming the gate electrode and a capacitor line on a substrate; a resist pattern formation step of forming, after the gate insulating film, a semiconductor film made of an oxide semiconductor, and a metal conductive film are formed in this order so as to cover the gate electrode and the capacitor line, a resist pattern on a region of a metal conductive film where the source and drain electrodes are to be formed such that a region to be the channel region and part of a region overlapping with the capacitor line are exposed; a first etching step of etching part of the metal conductive film exposed through the resist pattern to form the source and drain electrodes and the channel region and expose part of the semiconductor film through the drain electrode; a second etching step of etching, after the resist pattern formed in the first etching step is reflowed and reformed so as to cover the part of the semiconductor film exposed through the drain electrode and the channel region, part of the semiconductor film exposed through the reformed resist pattern to form the semiconductor layer, thereby forming each of the thin film transistors; an interlayer insulating film formation step of forming, after the resist pattern used in the second etching step is removed, an interlayer insulating film in which a contact hole is formed so as to reach part of the semiconductor layer exposed through the drain electrode; and a pixel electrode formation step of forming each of the pixel electrodes made of an oxide conductor on the interlayer insulating film to form each of the auxiliary capacitors with each of the pixel electrodes contacting the semiconductor layer.

According to the foregoing method, four photo masks are used as follows to manufacture the thin film transistor substrate including the auxiliary capacitors. For example, a first photo mask is, in the gate layer formation step, used to form the gate electrode and the capacitor line on the insulating substrate. A second photo mask is, in the resist pattern formation step, used to form the resist pattern, and the resist pattern is, in the first etching step, used to form the source and drain electrodes and the channel region. Then, the resist pattern formed from the reflowed resist pattern is, in the second etching step, used to form the semiconductor layer. In such a manner, the thin film transistor is formed. A third photo mask is, in the interlayer insulating film formation step, used to form the interlayer insulating film having the contact hole. A fourth photo mask is, in the pixel electrode formation step, used to form the pixel electrodes. In the manufactured thin transistor film substrate, the semiconductor layer is, at each pixel, positioned below the drain electrode. However, since part of the semiconductor film is exposed through the drain electrode when the source and drain electrodes and the channel region are formed in the first etching step, the pixel electrodes are formed in the pixel electrode formation step such that the semiconductor layer contacts each of the pixel electrodes at each pixel. In the foregoing configuration, the semiconductor layer is made of the oxide semiconductor, and the pixel electrodes are made of the oxide conductor. Thus, at each pixel, a band structure in the semiconductor layer and a band structure in each of the pixel electrodes are similar to each other. For such a reason, free carriers in each of the pixel electrodes are dispersed into the semiconductor layer and spread to the proximity of an interface between the semiconductor layer and the gate insulating film, and part of the semiconductor layer corresponding to each of the auxiliary capacitors functions as a conductor. Thus, in the auxiliary capacitor having a multilayer structure of the capacitor line, the gate insulating film, the semiconductor layer, and the drain electrode, when voltage is, at each pixel, applied between the capacitor line and the drain electrode, only the gate insulating film is a dielectric layer for retaining an electric charge in the foregoing part, and therefore a change in electrical capacitance can be reduced. Since the change in electrical capacitance can be reduced in each of the auxiliary capacitors each including the semiconductor layer, a change in electrical capacitance of the auxiliary capacitors due to the semiconductor layer can be reduced.

A liquid crystal display panel of the present invention includes a thin film transistor substrate and a counter substrate provided so as to face each other; and a liquid crystal layer provided between the thin film transistor substrate and the counter substrate. The thin film transistor substrate includes a plurality of pixel electrodes provided in a matrix, a plurality of thin film transistors each provided for a corresponding one of the pixel electrodes and connected to the corresponding one of the pixel electrodes, and a plurality of auxiliary capacitors each provided for a corresponding one of the pixel electrodes. Each of the thin film transistors includes a gate electrode provided on a substrate, a gate insulating film provided so as to cover the gate electrode, a semiconductor layer provided on the gate insulating film and having a channel region such that the channel region and the gate electrode overlap with each other, and source and drain electrodes provided on the semiconductor layer and arranged apart from each other with the channel region being interposed therebetween, the channel region being exposed through the source and drain electrodes. Each of the auxiliary capacitors includes a capacitor line made of a material identical to that of the gate electrode and provided in a layer identical to that of the gate electrode, the gate insulating film provided so as to cover the capacitor line, the semiconductor layer provided on the gate insulating film so as to overlap with the capacitor line, and the drain electrode provided on the semiconductor layer and connected to a corresponding one of the pixel electrodes. The semiconductor layer is made of an oxide semiconductor. Each of the pixel electrodes is made of an oxide conductor. The semiconductor layer and each of the pixel electrodes contact each other.

According to the foregoing configuration, in the thin film transistor substrate, the semiconductor layer of the thin film transistor is made of the oxide semiconductor, and the pixel electrodes are made of the oxide conductor. Thus, at each pixel, a band structure in the semiconductor layer and a band structure in each of the pixel electrodes are similar to each other. Since the semiconductor layer and the pixel electrode contact each other at each pixel, free carriers in each of the pixel electrodes are dispersed into the semiconductor layer and spread to the proximity of an interface between the semiconductor layer and the gate insulating film, and part of the semiconductor layer corresponding to each of the auxiliary capacitors functions as a conductor. Thus, in the auxiliary capacitor having a multilayer structure of the capacitor line, the gate insulating film, the semiconductor layer, and the drain electrode, when voltage is, at each pixel, applied between the capacitor line and the drain electrode, only the gate insulating film is a dielectric layer for retaining an electric charge in the foregoing part, and therefore a change in electrical capacitance can be reduced. Since the change in electrical capacitance can be reduced in each of the auxiliary capacitors each including the semiconductor layer, a change in electrical capacitance of the auxiliary capacitors due to the semiconductor layer can be reduced. In addition, in the liquid crystal display panel including the thin film transistor substrate, occurrence of display defects such as flicker is reduced.

Advantages of the Invention

According to the present invention, since the semiconductor layer made of the oxide semiconductor and the pixel electrode made of the oxide conductor contact each other, the change in electrical capacitance of the auxiliary capacitor due to the semiconductor layer can be reduced.

BRIEF DESCRIPTION OF THE DRAWINGS

FIG. 5 is a first cross-sectional view illustrating steps of manufacturing the TFT substrate of the first embodiment.

FIG. 7 is a third cross-sectional view illustrating steps of manufacturing the TFT substrate of the first embodiment after the steps illustrated in FIG. 6.

FIG. 9 is a first cross-sectional view illustrating steps of manufacturing the TFT substrate of the second embodiment.

FIG. 11 is a third cross-sectional view illustrating steps of manufacturing the TFT substrate of the second embodiment after the steps illustrated in FIG. 10.

DESCRIPTION OF EMBODIMENTS

Embodiments of the present invention will be described below in detail with reference to drawings. Note that the present invention is not limited to each of the embodiments described below.

First Embodiment of the Invention

Figure 1:
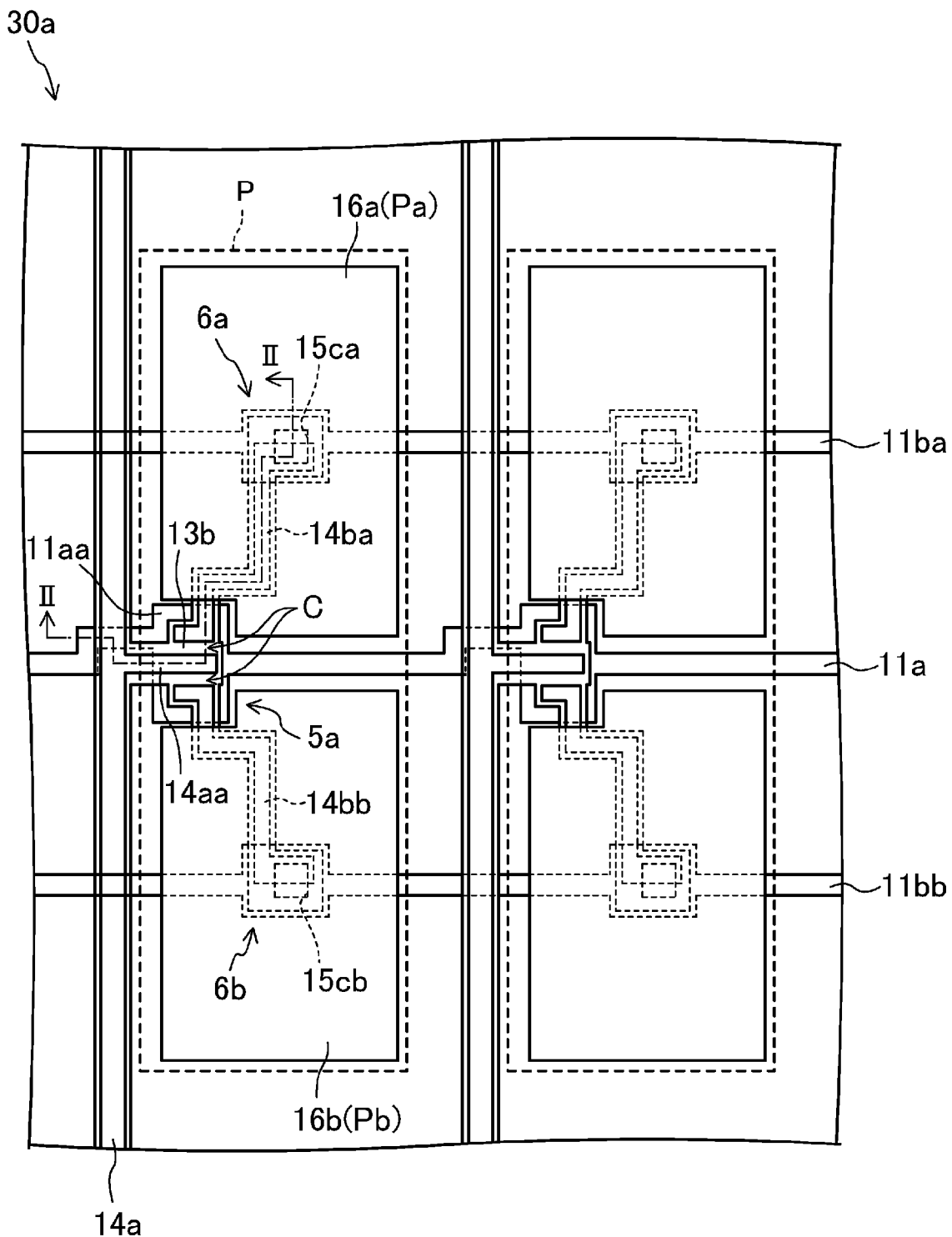
FIG. 1 is a plan view of a TFT substrate of a first embodiment.
Figure 2:
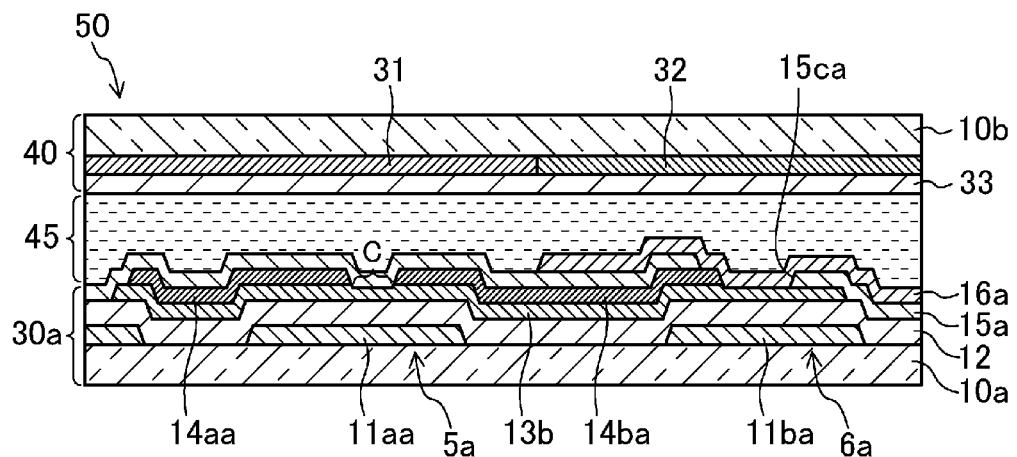
FIG. 2 is a cross-sectional view of a liquid crystal display panel including the TFT substrate along an II-II line illustrated in FIG. 1.
Figure 3:
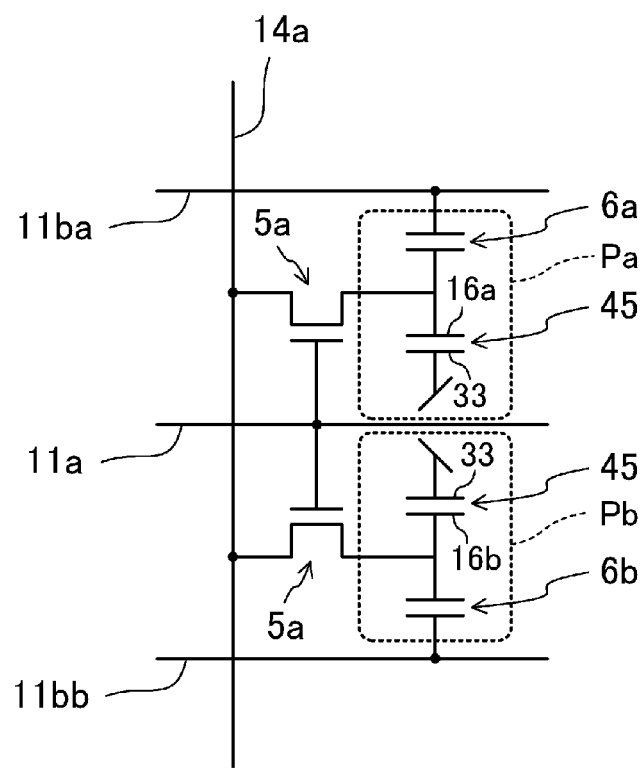
FIG. 3 is an equivalent circuit diagram of the TFT substrate of the first embodiment.

FIGS. 1-7 illustrate a TFT substrate, a manufacturing method thereof, and a liquid crystal display panel according to a first embodiment of the present invention. FIG. 1 is a plan view of a TFT substrate 30a of the present embodiment. FIG. 2 is a cross-sectional view of a liquid crystal display panel 50 including the TFT substrate 30a along an II-II line illustrated in FIG. 1. FIG. 3 is an equivalent circuit diagram of the TFT substrate 30a.

Referring to FIG. 2, the liquid crystal display panel 50 includes the TFT substrate 30a and a counter substrate 40 provided so as to face each other, a liquid crystal layer 45 provided between the TFT substrate 30a and the counter substrate 40, and a sealing material (not shown in the figure) bonding the TFT substrate 30a and the counter substrate 40 together and provided in a frame shape to seal the liquid crystal layer 45 between the TFT substrate 30a and the counter substrate 40.

Referring to FIGS. 1-3, the TFT substrate 30a includes the following: an insulating substrate 10a; a plurality of gate lines 11a provided on the insulating substrate 10a so as to extend parallel to each other; a plurality of first capacitor lines 11ba each provided on one side (upper side as viewed in FIG. 1) of a corresponding one of the gate lines 11a and arranged so as to extend parallel to each other; a plurality of second capacitor lines 11bb each provided on the other side (lower side as viewed in FIG. 1) of the corresponding one of the gate lines 11a and arranged so as to extend parallel to each other; a plurality of source lines 14a provided so as to extend parallel to each other in a direction perpendicular to the gate lines 11a; TFTs 5a each provided at an intersection between each of the gate lines 11a and each of the source lines 14a, i.e., at each of pixels P; an interlayer insulating film 15a provided so as to cover the TFTs 5a; a plurality of pixel electrodes, i.e., first pixel electrodes 16a and second pixel electrodes 16b, provided in a matrix on the interlayer insulating film 15a and arranged such that each of the first pixel electrodes 16a and each of the second pixel electrodes 16b are adjacent to each other with a corresponding one of the gate lines 11a being interposed therebetween; and an alignment film (not shown in the figure) provided so as to cover the pixel electrodes (first and second pixel electrodes 16a, 16b).

Referring to FIGS. 1 and 2, each of the TFTs 5a includes the following: a gate electrode 11aa provided on the insulating substrate 10a; a gate insulating film 12 provided so as to cover the gate electrode 11aa; a semiconductor layer 13b provided on the gate insulating film 12 and having a pair of channel regions C such that the channel regions C overlap with the gate electrode 11aa; a source electrode 14aa provided on the semiconductor layer 13b and arranged such that the pair of channel regions C are exposed; a first drain electrode 14ba provided on the semiconductor layer 13b and arranged apart from the source electrode 14aa with one of the channel regions C (on the upper side as viewed in FIG. 1) being interposed therebetween; and a second drain electrode 14bb provided on the semiconductor layer 13b and arranged apart from the source electrode 14aa with the other channel region C (on the lower side as viewed in FIG. 1) being interposed therebetween.

Referring to FIG. 1, the gate electrode 11aa is a wide part of the gate line 11a.

The semiconductor layer 13b is made of an In—Ga—Zn—O based oxide semiconductor such as InGaZnO$_4$ or In$_2$Ga$_2$ZnO$_7$. The first pixel electrode 16a and the second pixel electrode 16b are made of an oxide conductor such as indium tin oxide (ITO) or indium zinc oxide (IZO). Referring to FIGS. 1 and 2, the semiconductor layer 13b contacts the first pixel electrode 16a in a contact hole 15ca formed in the interlayer insulating film 15a, and contacts the second pixel electrode 16b in a contact hole 15cb formed in the interlayer insulating film 15a.

Referring to FIG. 1, the source electrode 14aa is a laterally-protruding part of the source line 14a.

Referring to FIGS. 1 and 2, the first drain electrode 14ba is connected to the first pixel electrode 16a through the contact hole 15ca formed in the interlayer insulating film 15a. In addition, the first drain electrode 14ba forms, referring to FIGS. 1 and 2, a first auxiliary capacitor 6a in the state in which the first drain electrode 14ba overlaps with the first capacitor line 11ba with the semiconductor layer 13b and the gate insulating film 12 being interposed therebetween.

Referring to FIG. 1, the second drain electrode 14bb is connected to the second pixel electrode 16b through the contact hole 15cb formed in the interlayer insulating film 15a. In addition, the second drain electrode 14bb forms, referring to FIG. 1, a second auxiliary capacitor 6b in the state in which the second drain electrode 14bb overlaps with the second capacitor line 11bb with the semiconductor layer 13b and the gate insulating film 12 being interposed therebetween.

Referring to FIG. 2, the counter substrate 40 includes an insulating substrate 10b, a black matrix 31 provided in a grid pattern on the insulating substrate 10b, a color filter 32 in which, e.g., each of red layers, green layers, and blue layers is provided between adjacent ones of grids of the black matrix 31, a common electrode 33 provided so as to cover the black matrix 31 and the color filter 32, and an alignment film (not shown in the figure) provided so as to cover the common electrode 33.

The counter substrate 40 has electro-optical properties, and is made of, e.g., a nematic liquid crystal material having negative dielectric anisotropy.

Figure 4:
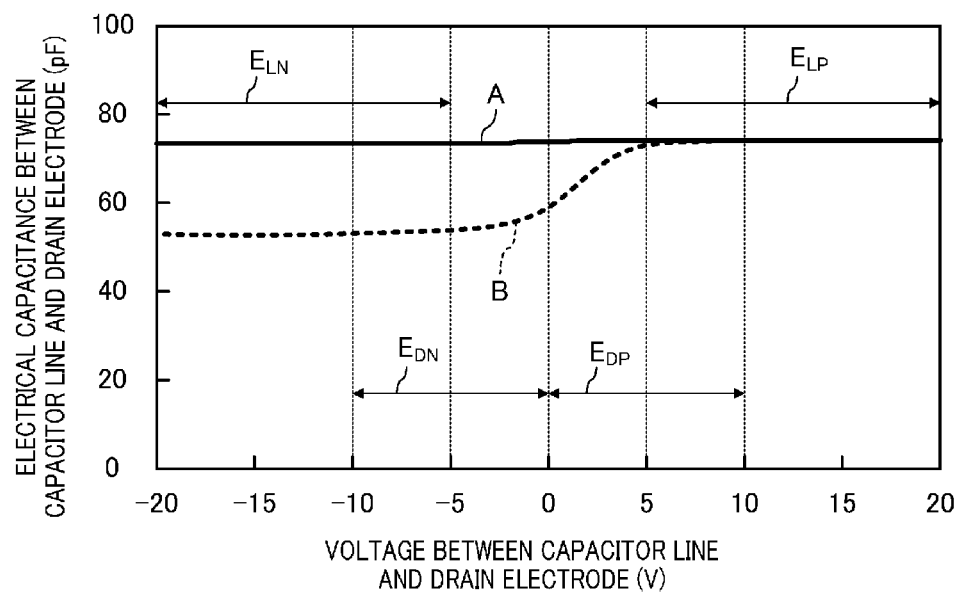
FIG. 4 is a graph illustrating a relationship between voltage and electrical capacitance in an auxiliary capacitor of the TFT substrate of the first embodiment.

The liquid crystal display panel 50 having the foregoing configuration is configured as follows. For each of sub-pixels Pa, Pb, an alignment state of the liquid crystal layer 45 is changed by applying predetermined voltage to the liquid crystal layer 45 interposed between each of the first and second pixel electrodes 16a, 16b of the TFT substrate 30a and the common electrode 33 of the counter substrate 40. In such a manner, the transmittance of light passing through the panel is adjusted at each of the sub-pixels Pa, Pb, thereby displaying an image. In the liquid crystal display panel 50, referring to FIG. 3, e.g., voltage of −20-−5 V or +5-+20 V is applied to the first auxiliary capacitor 6a, and, e.g., voltage of −10-0 V or 0-+10 V is applied to the second auxiliary capacitor 6b. Since voltage is, with different voltage magnitudes, applied to a liquid crystal capacitor (liquid crystal layer 45) for the sub-pixel Pa and a liquid crystal capacitor (liquid crystal layer 45)

for the sub-pixel Pb, the sub-pixels Pa, Pb serve respectively as a light sub-pixel and a dark sub-pixel. Thus, an image can be displayed in the state in which contrast inversion due to visual dependency on gradation is reduced. FIG. 4 is a graph illustrating a relationship between voltage and electrical capacitance in the auxiliary capacitor (i.e., the first auxiliary capacitor 6a or the second auxiliary capacitor 6b) of the TFT substrate. In FIG. 4, a solid line A represents a relationship between voltage and electrical capacitance in a TFT substrate of an example of the present embodiment in which a semiconductor layer and pixel electrodes contact each other, and a dashed line B represents a relationship between voltage and electrical capacitance in a TFT substrate of a comparative example of the present embodiment in which pixel electrodes contact only drain electrodes and a semiconductor layer and the pixel electrodes do not contact each other. Considering the foregoing range of voltage to be applied, the following ranges are defined in FIG. 4: a range $E_{LP}$ is a main operating range of a light sub-pixel for positive bias voltage; a range $E_{LN}$ is a main operating range of a light sub-pixel for negative bias voltage; a range $E_{DP}$ is a main operating range of a dark sub-pixel for positive bias voltage; and a range $E_{DN}$ is a main operating range of a dark sub-pixel for negative bias voltage. As will be seen from FIG. 4, in the TFT substrate (see the solid line A) of the example of the present embodiment, the electrical capacitance of the auxiliary capacitor is substantially maintained constant regardless of the magnitude of voltage to be applied to the auxiliary capacitor. On the other hand, in the TFT substrate (see the dashed line B) of the comparative example of the present embodiment, the electrical capacitance of the auxiliary capacitor varies depending on the magnitude of voltage to be applied to the auxiliary capacitor.

Figure 6:
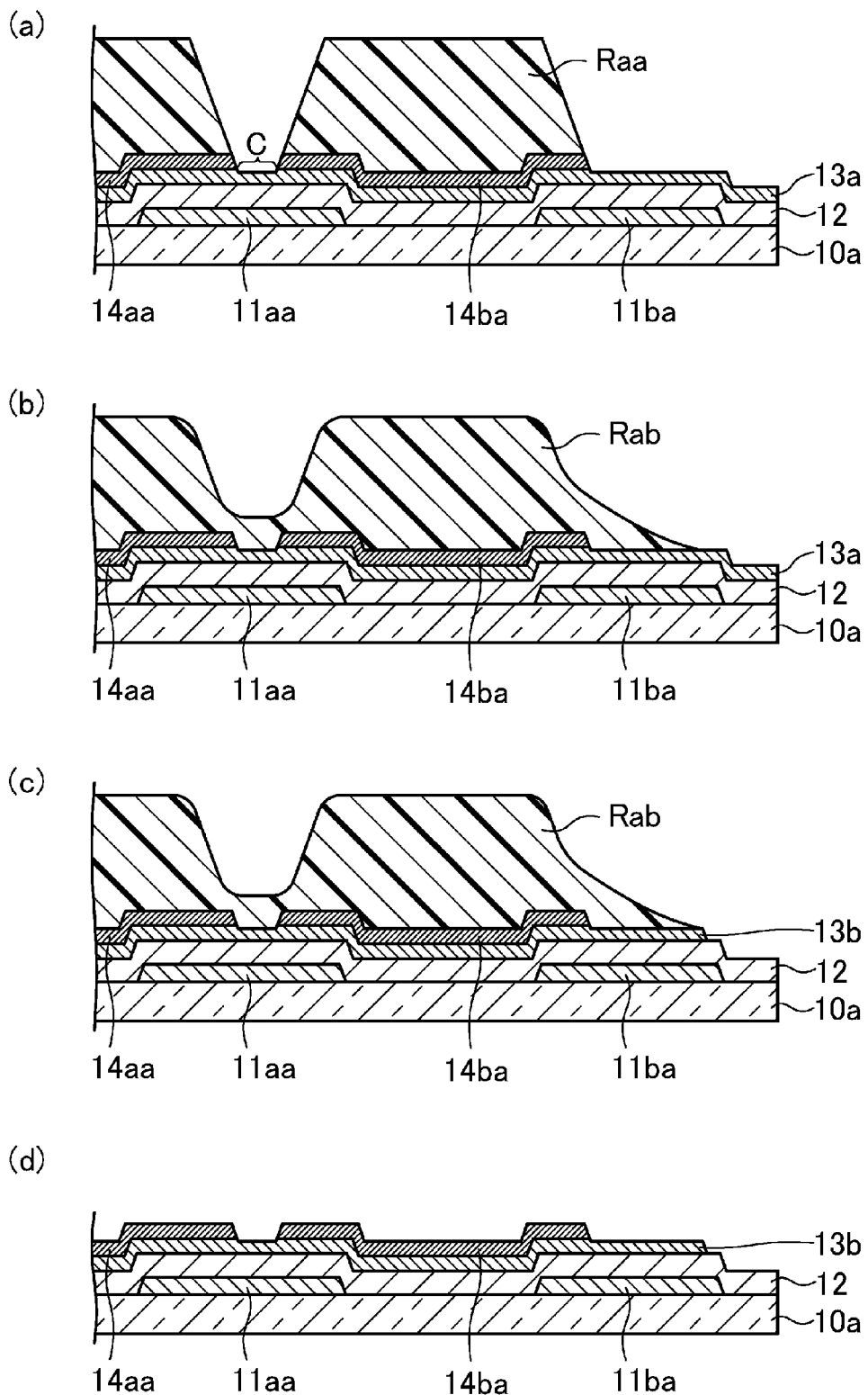
FIG. 6 is a second cross-sectional view illustrating steps of manufacturing the TFT substrate of the first embodiment after the steps illustrated in FIG. 5.

Next, a method for manufacturing the TFT substrate 30a of the present embodiment will be described with reference to FIGS. 5-7. FIGS. 5-7 are cross-sectional views corresponding to the TFT substrate 30a of the cross-sectional view illustrated in FIG. 2 and illustrating a sequence of steps of manufacturing the TFT substrate 30a of the present embodiment. The manufacturing method of the present embodiment includes a gate layer formation step, a resist pattern formation step, a first etching step, a second etching step, an interlayer insulating film formation step, and a pixel electrode formation step.

Gate Layer Formation Step

A metal film such as a titanium film (having a thickness of about 1500-6000 Å) is formed on the entirety of an insulating substrate 10a such as a glass substrate by, e.g., sputtering. Then, the metal film is patterned by using a first photo mask, thereby forming, referring to FIG. 5(a), a gate line 11a, a gate electrode 11aa, a first capacitor line 11ba, and a second capacitor line 11bb.

Resist Pattern Formation Step

First, a silicon nitride film (having a thickness of about 1000-4500 Å), a silicon oxide film (having a thickness of about 500-1500 Å), etc. are, by, e.g., chemical vapor deposition (CVD), formed in this order on the entirety of the substrate on which the gate line 11a, the gate electrode 11aa, the first capacitor line 11ba, and the second capacitor line 11bb are formed in the gate layer formation step. In such a manner, a gate insulating film 12 is formed as illustrated in FIG. 5(b).

Subsequently, as illustrated in FIG. 5(c), an In—Ga—Zn—O based semiconductor film 13 such as InGaZnO$_4$ (having a thickness of about 200-800 Å), a metal conductive film 14 such as a titanium film (having a thickness of about 1500-6000 Å), etc. are, by, e.g., the sputtering, formed in this order on the entirety of the substrate on which the gate insulating film 12 is formed.

A photosensitive resin film (having a thickness of about 1.5-3.0 nm) is formed on the entirety of the substrate on which the semiconductor film 13 and the metal conductive film 14 are formed. Then, the photosensitive resin film is exposed to light, developed, and baked by using a second photo mask. In such a manner, a resist pattern Raa is formed as illustrated in FIG. 5(d). Referring to FIG. 5(d), on a region where a source line 14a, a source electrode 14aa, a first drain electrode 14ba, and a second drain electrode 14bb will be formed, the resist pattern Raa is formed such that part of a region where the first capacitor line 11ba and the second capacitor line 11bb overlap with each other and a region which will be formed into channel regions C are exposed.

First Etching Step

Part of the metal conductive film 14 exposed through the resist pattern Raa formed in the resist pattern formation step and an upper part of the semiconductor film 13 formed below the metal conductive film 14 are etched by wet etching. In such a manner, the source line 14a, the source electrode 14aa, the first drain electrode 14ba, the second drain electrode 14bb, and the channel regions C (i.e., a semiconductor film 13a having the channel regions C) are formed as illustrated in FIG. 6(a).

Second Etching Step

First, the substrate on which the source line 14a, the source electrode 14aa, the first drain electrode 14ba, the second drain electrode 14bb, and the channel regions C are formed in the first etching step is heated at about 250° C. In such a manner, the resist pattern Raa is reflowed (i.e., melted and re-solidified) as illustrated in FIG. 6(b). Then, the resist pattern Raa is formed into a resist pattern Rab in which part of the semiconductor film 13a exposed through the first drain electrode 14ba and the second drain electrode 14bb and the channel regions C are covered.

Subsequently, in such a manner that part of the semiconductor film 13a exposed through the resist pattern Rab is etched by the wet etching, a semiconductor layer 13b is formed as illustrated in FIG. 6(c). In such a manner, a TFT 5a is formed.

Interlayer Insulating Film Formation Step

Referring to FIG. 6(d), the resist pattern Rab is first removed from the substrate on which the TFT 5a is formed in the second etching step.

Subsequently, a silicon oxide film (having a thickness of about 1000-4000 Å) etc. are, by, e.g., the CVD, formed on the entirety of the substrate from which the resist pattern Rab is removed. In such a manner, an inorganic insulating film 15 is formed as illustrated in FIG. 7(a). The silicon oxide film is preferable as the inorganic insulating film 15, but, e.g., a multilayer film of a silicon oxide film and a silicon nitride film or a silicon nitride film may be formed.

Then, the inorganic insulating film 15 is patterned by using a third photo mask. In such a manner, an interlayer insulating film 15a having contact holes 15ca, 15cb is formed as illustrated in FIG. 7(b).

Pixel Electrode Formation Step

First, an ITO film (having a thickness of about 600-2000 Å) etc. are, by, e.g., the sputtering, formed on the entirety of the substrate on which the interlayer insulating film 15a is formed in the interlayer insulating film formation step. In such a manner, a transparent conductive film 16 is formed as illustrated in FIG. 7(b).

Subsequently, the transparent conductive film 16 is patterned by using a fourth photo mask. In such a manner, as illustrated in FIG. 2, a first pixel electrode 16a and a second pixel electrode 16b are formed, and a first auxiliary capacitor 6a and a second auxiliary capacitor 6b are formed with the first pixel electrode 16a and the second pixel electrode 16b contacting the semiconductor layer 13b.

In the foregoing manner, the TFT substrate 30a can be manufactured.

As described above, according to the TFT substrate 30a and the manufacturing method thereof in the present embodiment, the four photo masks are used as follows to manufacture the TFT substrate 30a including the first auxiliary capacitor 6a and the second auxiliary capacitor 6b. The first photo mask is, in the gate layer formation step, used to form the gate electrode 11aa, the first capacitor line 11ba, and the second capacitor line 11bb on the insulating substrate 10a. The second photo mask is, in the resist pattern formation step, used to form the resist pattern Raa, and the resist pattern Raa is, in the first etching step, used to form the source electrode 14aa, the first drain electrode 14ba, the second drain electrode 14bb, and the channel regions C. Then, the resist pattern Rab formed from the reflowed resist pattern Raa is, in the second etching step, used to form the semiconductor layer 13b. In such a manner, the TFT 5a is formed. The third photo mask is, in the interlayer insulating film formation step, used to form the interlayer insulating film 15a having the contact holes 15ca, 15cb. The fourth photo mask is, in the pixel electrode formation step, used to form the first pixel electrode 16a and the second pixel electrode 16b. In such a manner, the first auxiliary capacitor 6a and the second auxiliary capacitor 6b are formed. In the manufactured TFT substrate 30a, the semiconductor layer 13b is, at each of the sub-pixels Pa, Pb, positioned below the first drain electrode 14ba or the second drain electrode 14bb. However, since part of the semiconductor film 13a is exposed through the first drain electrode 14ba and the second drain electrode 14bb when the source electrode 14aa, the first drain electrode 14ba, the second drain electrode 14bb and the channel regions C are formed in the first etching step, the first pixel electrode 16a and the second pixel electrode 16b are formed in the pixel electrode formation step such that the semiconductor layer 13b contacts the first pixel electrode 16a or the second pixel electrode 16b at each of the sub-pixels Pa, Pb. In the foregoing configuration, the semiconductor layer 13b is made of an oxide semiconductor, and the first pixel electrode 16a and the second pixel electrode 16b are made of an oxide conductor. Thus, at each of the sub-pixels Pa, Pb, a band structure in the semiconductor layer 13b and a band structure in the first pixel electrode 16a or the second pixel electrode 16b are similar to each other. For such a reason, free carriers in the first pixel electrode 16a and the second pixel electrode 16b are, at each of the sub-pixels Pa, Pb, dispersed into the semiconductor layer 13b and spread to the proximity of an interface between the semiconductor layer 13b and the gate insulating film 12, and part of the semiconductor layer 13b corresponding to the first auxiliary capacitor 6a and the second auxiliary capacitor 6b functions as a conductor. Thus, in the first auxiliary capacitor 6a having a multilayer structure of the first capacitor line 11ba, the gate insulating film 12, the semiconductor layer 13b, and the first drain electrode 14ba and the second auxiliary capacitor 6b having a multilayer structure of the second capacitor line 11bb, the gate insulating film 12, the semiconductor layer 13b, and the second drain electrode 14bb, when voltage is applied to part between the first capacitor line 11ba and the first drain electrode 14ba and between the second capacitor line 11bb and the second drain electrode 14bb, only the gate insulating film 12 is a dielectric layer for retaining an electric charge in the foregoing part, and therefore a change in electrical capacitance can be reduced. Since the change in electrical capacitance can be reduced in the first auxiliary capacitor 6a and the second auxiliary capacitor 6b each including the semiconductor layer 13b, a change in electrical capacitance of the first auxiliary capacitor 6a and the second auxiliary capacitor 6b due to the semiconductor layer 13b can be reduced.

In the TFT substrate 30a of the present embodiment, each of the pixels P has a multi-pixel structure of the light sub-pixel (Pa) and the dark sub-pixel (Pb). In order to differentiate between voltage to be applied to part of the liquid crystal layer 45 corresponding to the light sub-pixel (Pa) and voltage to be applied to part of the liquid crystal layer 45 corresponding to the dark sub-pixel (Pb), voltage to be applied between the first capacitor line 11ba and the first drain electrode 14ba and voltage to be applied between the second capacitor line 11bb and the second drain electrode 14bb are differentiated from each other. In such a case, e.g., if a semiconductor layer is simply stacked inside first and second auxiliary capacitors, the foregoing differentiation may result in a change in electrical capacitance of the first and second auxiliary capacitors. On the other hand, in the TFT substrate 30a of the present embodiment, since the semiconductor layer 13b and each of the first and second pixel electrodes 16a, 16b contact, as described above, each other at each of the sub-pixels Pa, Pb, the following can be effectively reduced: a change in electrical capacitance of the first auxiliary capacitor 6a due to voltage applied between the first capacitor line 11ba and the first drain electrode 14ba; and a change in electrical capacitance of the second auxiliary capacitor 6b due to voltage applied between the second capacitor line 11bb and the second drain electrode 14bb. In the liquid crystal display panel 50 including the TFT substrate 30a, the change in electrical capacitance of the first auxiliary capacitor 6a and the second auxiliary capacitor 6b can be reduced. Thus, predetermined voltage can be applied to part of the liquid crystal layer 45 corresponding to the light sub-pixel (Pa) and part of the liquid crystal layer 45 corresponding to the dark sub-pixel (Pb) in the state in which a balance with voltage of the common electrode 33 of the counter substrate 40 is maintained at each of the sub-pixels Pa, Pb, thereby reducing occurrence of display defects such as flicker.

In the TFT substrate 30a of the present embodiment, part of the semiconductor layer 13b corresponding to the first auxiliary capacitor 6a and the second auxiliary capacitor 6b functions as a conductor. Thus, even if the semiconductor layer 13b is interposed between the first pixel electrode 16a and the first drain electrode 14ba and between the second pixel electrode 16b and the second drain electrode 14bb, the first pixel electrode 16a and the second pixel electrode 16b can be satisfactorily connected respectively to the first drain electrode 14ba and the second drain electrode 14bb. On the other hand, in the case where part of a semiconductor layer corresponding to an auxiliary capacitor is, for the purpose of reducing a change in electrical capacitance of the auxiliary capacitor, removed and a pixel electrode forms a capacitor electrode, the pixel electrode and a drain electrode are connected together only at a side surface of a contact hole, and therefore there are concerns about connection failure between the pixel electrode and the drain electrode. In order to overcome the connection failure, the diameter of the contact hole is increased. However, this leads to concerns about reduction in aperture ratio of a pixel.

In the TFT substrate 30a of the present embodiment, since the semiconductor layer 13b is made of the oxide semiconductor, the TFT 5a having favorable properties such as high mobility, high reliability, and low off-current can be realized.

Second Embodiment of the Invention

Figure 8:
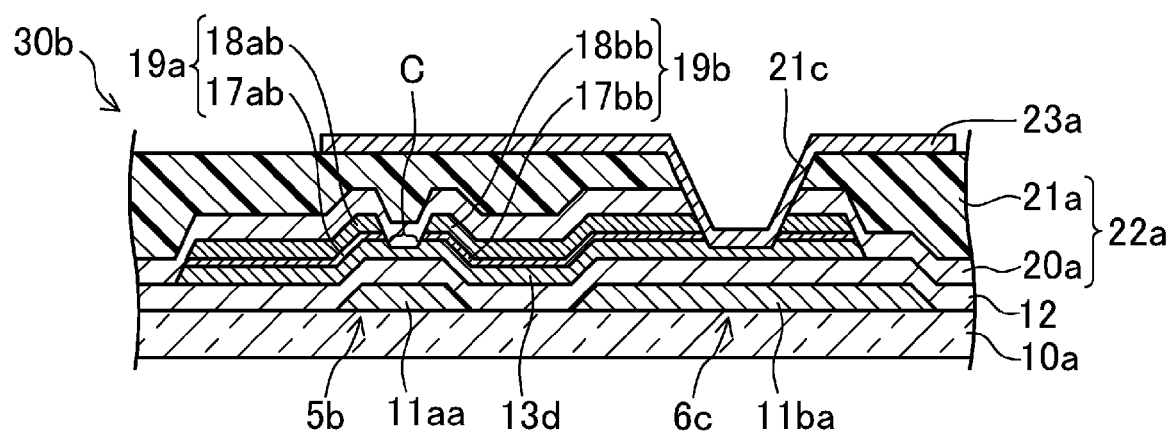
FIG. 8 is a cross-sectional view of a TFT substrate of a second embodiment.

FIGS. 8-12 illustrate a TFT substrate and a manufacturing method thereof according to a second embodiment of the present invention. FIG. 8 is a cross-sectional view of a TFT substrate 30b of the present embodiment. FIGS. 9-12 are cross-sectional views corresponding to the cross-sectional view illustrated in FIG. 8 and illustrating a sequence of steps of manufacturing the TFT substrate 30b of the present embodiment. Note that the same reference numerals as those shown in FIGS. 1-7 are used to represent equivalent elements in each of the following embodiments, and description thereof will not be repeated.

In the first embodiment, the TFT substrate 30a has been described, in which the drain electrode protrudes in the contact hole formed in the interlayer insulating film and a source layer including the source line, the source electrode, and the drain electrode and the interlayer insulating film each have a single-layer structure. On the other hand, in the present embodiment, the TFT substrate 30b will be described, in which a drain electrode does not protrude in a contact hole formed in an interlayer insulating film and a source layer including a source line, a source electrode, and a drain electrode and the interlayer insulating film each have a double-layer structure.

Referring to FIG. 8, the TFT substrate 30b includes the following: an insulating substrate 10a; a plurality of gate lines (see "11a" in FIG. 1) provided on the insulating substrate 10a so as to extend parallel to each other; a plurality of first capacitor lines 11ba each provided on one side of a corresponding one of the gate lines (11a) and arranged so as to extend parallel to each other; a plurality of second capacitor lines (see "11bb" in FIG. 1) each provided on the other side of the corresponding one of the gate lines (11a) and arranged so as to extend parallel to each other; a plurality of source lines (not shown in the figure and see "14a" in FIG. 1) provided so as to extend parallel to each other in a direction perpendicular to the gate lines (11a); TFTs 5b each provided at an intersection between each of the gate lines (11a) and each of the source lines; an interlayer insulating film 22a provided so as to cover the TFTs 5b and having a stack of a first interlayer insulating film 20a and a second interlayer insulating film 21a; a plurality of pixel electrodes, i.e., first pixel electrodes 23a and second pixel electrodes (not shown in the figure and see "16b" in FIG. 1), provided in a matrix on the interlayer insulating film 22a and arranged such that each of the first pixel electrodes 23a and each of the second pixel electrodes are adjacent to each other with a corresponding one of the gate lines (11a) being interposed therebetween; and an alignment film (not shown in the figure) provided so as to cover the pixel electrodes (i.e., the first pixel electrodes 23a and the second pixel electrodes).

Referring to FIG. 8, each of the TFTs 5b includes the following: a gate electrode 11aa provided on the insulating substrate 10a; a gate insulating film 12 provided so as to cover the gate electrode 11aa; a semiconductor layer 13d provided on the gate insulating film 12 and having a pair of channel regions C such that the channel regions C overlap with the gate electrode 11aa; a source electrode 19a provided on the semiconductor layer 13d and arranged such that the pair of channel regions C are exposed; a first drain electrode 19b provided on the semiconductor layer 13d and arranged apart from the source electrode 19a with one of the channel regions C being interposed therebetween; and a second drain electrode (not shown in the figure and see "14bb" in FIG. 1) provided on the semiconductor layer 13d and arranged apart from the source electrode 19a with the other channel region C being interposed therebetween.

The semiconductor layer 13d is made of an In—Ga—Zn—O based oxide semiconductor such as $InGaZnO_4$ or $In_2Ga_2ZnO_7$. The first pixel electrode 23a and the second pixel electrode are made of an oxide conductor such as indium tin oxide (ITO) or indium zinc oxide (IZO). Referring to FIG. 8, the semiconductor layer 13d contacts the first pixel electrode 23a in a contact hole 21c formed in the interlayer insulating film 22a, and contacts the second pixel electrode in a contact hole (not shown in the figure) formed in the interlayer insulating film 22a.

The source electrode 19a is a laterally-protruding part of the source line.

Referring to FIG. 8, the first drain electrode 19b is connected to the first pixel electrode 23a through the contact hole 21c formed in the interlayer insulating film 22a. In addition, the first drain electrode 19b forms a first auxiliary capacitor 6c in the state in which the first drain electrode 19b overlaps with the first capacitor line 11ba with the semiconductor layer 13d and the gate insulating film 12 being interposed therebetween.

The second drain electrode is connected to the second pixel electrode through a contact hole (not shown in the figure) formed in the interlayer insulating film 22a. In addition, the second drain electrode forms a second auxiliary capacitor in the state in which the second drain electrode overlaps with the second capacitor line (11bb) with the semiconductor layer 13d and the gate insulating film 12 being interposed therebetween.

Next, a method for manufacturing the TFT substrate 30b of the present embodiment will be described with reference to FIGS. 9-12. The manufacturing method of the present embodiment includes a gate layer formation step, a resist pattern formation step, a first etching step, a second etching step, an interlayer insulating film formation step, and a pixel electrode formation step.

Gate Layer Formation Step

A metal film such as a titanium film (having a thickness of about 1500-6000 Å) is formed on the entirety of an insulating substrate 10a such as a glass substrate by, e.g., sputtering. Then, the metal film is patterned by using a first photo mask, thereby forming, referring to FIG. 9(a), a gate line (11a), a gate electrode 11aa, a first capacitor line 11ba, and a second capacitor line (11bb).

Resist Pattern Formation Step

First, a silicon nitride film (having a thickness of about 1000-4500 Å), a silicon oxide film (having a thickness of about 500-1500 Å), etc. are, by, e.g., CVD, formed in this order on the entirety of the substrate on which the gate line (11a), the gate electrode 11aa, the first capacitor line 11ba, and the second capacitor line (11bb) are formed in the gate layer formation step. In such a manner, a gate insulating film 12 is formed as illustrated in FIG. 9(b).

Subsequently, as illustrated in FIG. 9(c), an In—Ga—Zn—O based semiconductor film 13 such as $InGaZnO_4$ (having a thickness of about 200-800 Å), a first metal conductive film 17 such as a molybdenum film (having a thickness of about 500-2000 Å), and a second metal conductive film 18 such as a copper film (having a thickness of about 1000-3500 Å) are, by, e.g., the sputtering, formed in this order on the entirety of the substrate on which the gate insulating film 12 is formed.

A photosensitive resin film (having a thickness of about 1.5-3.0 nm) is formed on the entirety of the substrate on which the semiconductor film 13 and a multilayer metal film 19 including the first metal conductive film 17 and the second metal conductive film 18 are formed. Then, the photosensitive film is exposed to light, developed, and baked by using a second photo mask. In such a manner, a resist pattern Rba is formed as illustrated in FIG. 9(*d*). Referring to FIG. 9(*d*), on a region where a source line, a source electrode 19*a*, a first drain electrode 19*b*, and a second drain electrode will be formed, the resist pattern Rab is formed such that part of a region where the first capacitor line 11*ba* and the second capacitor line (11*bb*) overlap with each other and a region which will be formed into channel regions C are exposed.

First Etching Step

Part of the multilayer metal film 19 exposed through the resist pattern Rba formed in the resist pattern formation step and an upper part of the semiconductor film 13 formed below the multilayer metal film 19 are etched by wet etching. In such a manner, the source line, the source electrode (19*a*) including a lower metal layer 17*aa* and an upper metal layer 18*aa*, the first drain electrode (19*b*) including a lower metal layer 17*ba* and an upper metal layer 18*ba*, the second drain electrode, and the channel regions C (i.e., a semiconductor film 13*c* having the channel regions C) are formed as illustrated in FIG. 10(*a*).

Second Etching Step

First, the substrate on which the source line, the source electrode (19*a*), the first drain electrode (19*b*), the second drain electrode, and the channel regions C are formed in the first etching step is heated at about 250° C. In such a manner, the resist pattern Rba is reflowed as illustrated in FIG. 10(*b*). Then, the resist pattern Rba is formed into a resist pattern Rbb in which part of the semiconductor film 13*c* exposed through the first drain electrode (19*b*) and the second drain electrode and the channel regions C are covered.

Figure 10:
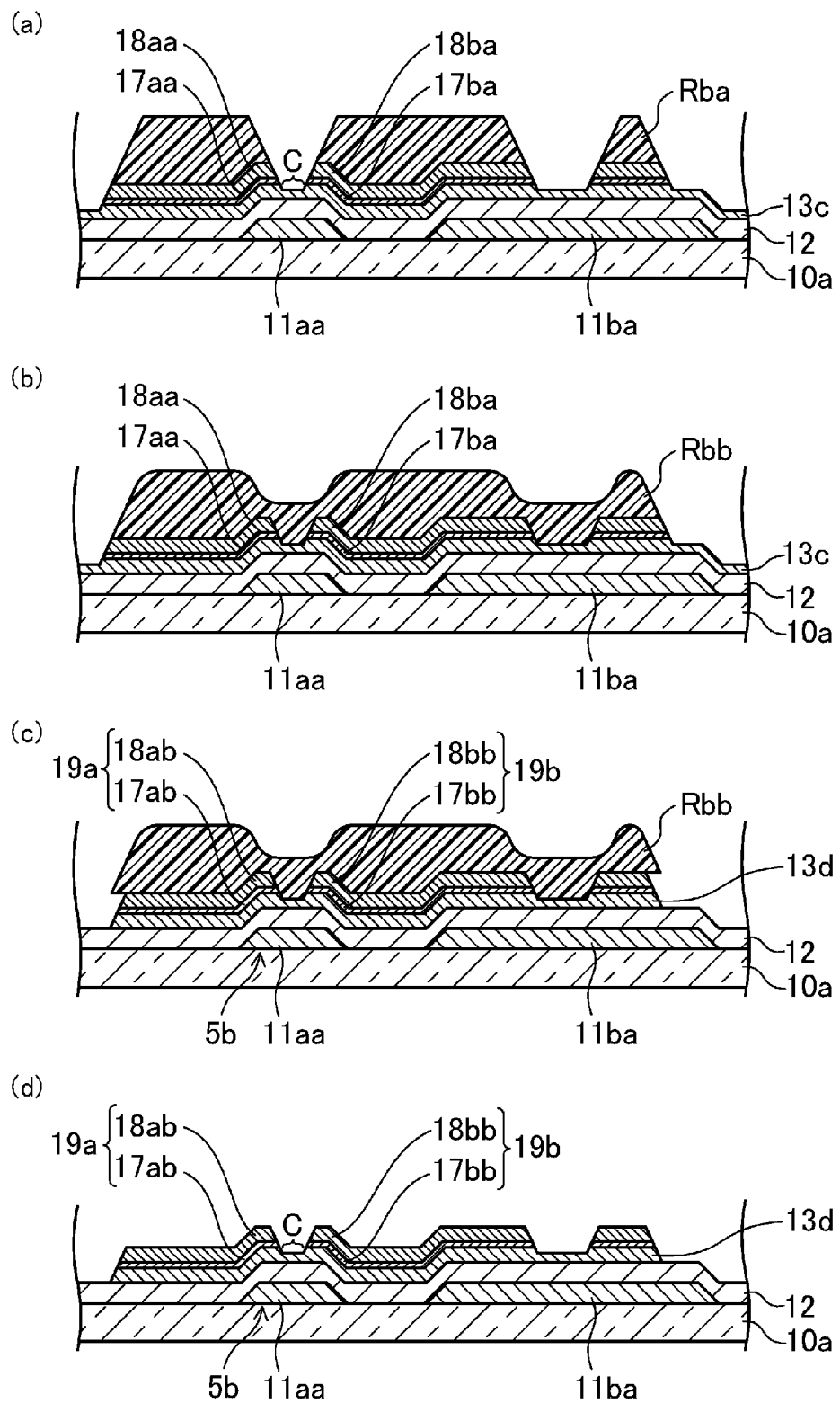
FIG. 10 is a second cross-sectional view illustrating steps of manufacturing the TFT substrate of the second embodiment after the steps illustrated in FIG. 9.

Subsequently, part of the semiconductor film 13*c* exposed through the resist pattern Rbb is etched by the wet etching, thereby forming a semiconductor layer 13*d* as illustrated in FIG. 10(*c*). In such a manner, a TFT 5*b* is formed. At this point, the source line, the source electrode (19*a*) including the lower metal layer 17*aa* and the upper metal layer 18*aa*, the first drain electrode (19*b*) including the lower metal layer 17*ba* and the upper metal layer 18*ba*, and the second drain electrode are laterally etched by isotropic wet etching. In such a manner, a source line, a source electrode 19*a* including a lower metal layer 17*ab* and an upper metal layer 18*ab*, a first drain electrode 19*b* including a lower metal layer 17*bb* and an upper metal layer 18*bb*, and a second drain electrode are formed as illustrated in FIG. 10(*c*).

Interlayer Insulating Film Formation Step

Referring to FIG. 10(*d*), the resist pattern Rbb is first removed from the substrate on which the TFT 5*b* is formed in the second etching step.

Subsequently, a silicon oxide film (having a thickness of about 1000-4000 Å) etc. are, by, e.g., the CVD, formed on the entirety of the substrate from which the resist pattern Rbb is removed. In such a manner, an inorganic insulating film 20 is formed as illustrated in FIG. 11(*a*). The silicon oxide film is preferable as the inorganic insulating film 20, but, e.g., a multilayer film of a silicon oxide film and a silicon nitride film or a silicon nitride film may be formed.

Subsequently, a photosensitive resin film is, by, e.g., spin coating, formed on the entirety of the substrate on which the inorganic insulating film 20 is formed. In such a manner, an organic insulating film 21 is formed as illustrated in FIG. 11(*b*).

Then, the organic insulating film 21 is exposed to light, developed, and baked by using a third photo mask. In such a manner, a second interlayer insulating film 21*a* having a contact hole 21*c* is formed as illustrated in FIG. 11(*c*).

Figure 12:
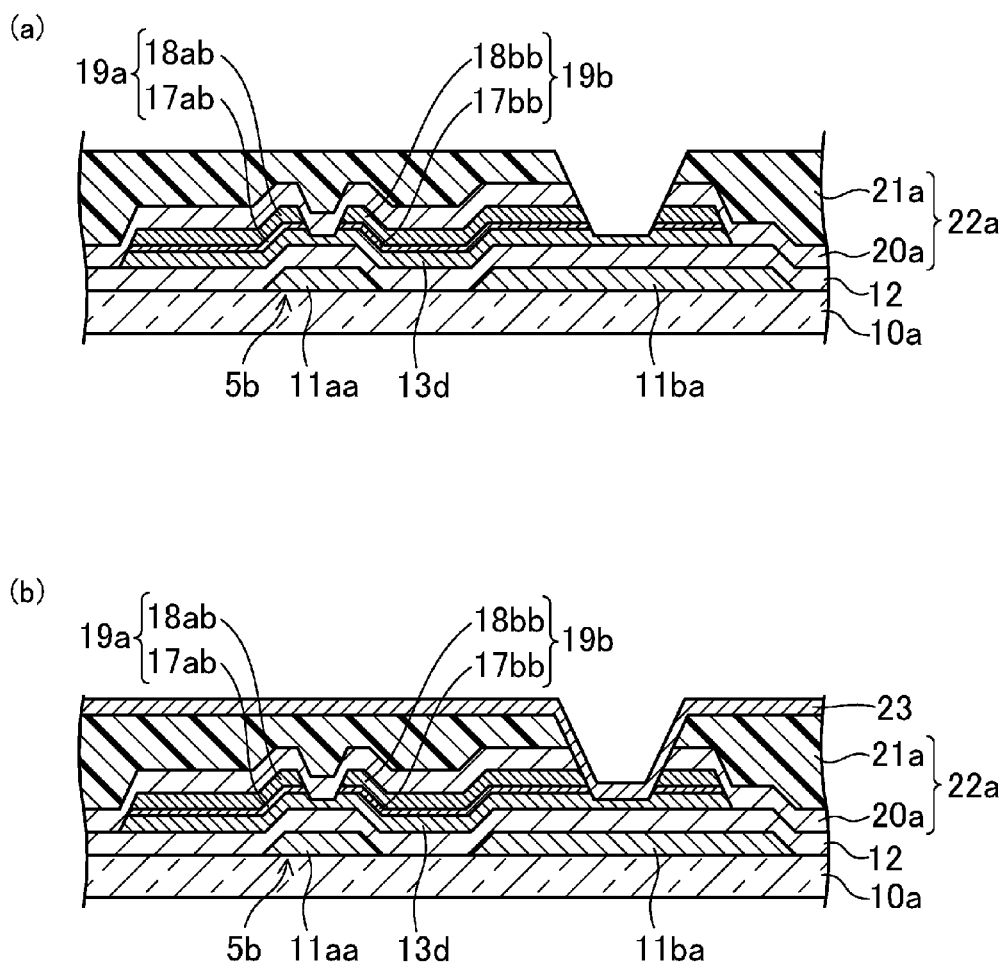
FIG. 12 is a fourth cross-sectional view illustrating steps of manufacturing the TFT substrate of the second embodiment after the steps illustrated in FIG. 11.

Part of the inorganic insulating film 20 exposed through the contact hole 21*c* of the second interlayer insulating film 21*a* is etched, thereby forming a first interlayer insulating film 20*a* as illustrated in FIG. 12(*a*). In such a manner, an interlayer insulating film 22*a* including the first interlayer insulating film 20*a* and the second interlayer insulating film 21*a* is formed.

Pixel Electrode Formation Step

First, an ITO film (having a thickness of about 600-2000 Å) etc. are, by, e.g., the sputtering, formed on the entirety of the substrate on which the interlayer insulating film 22*a* is formed in the interlayer insulating film formation step. In such a manner, a transparent conductive film 23 is formed as illustrated in FIG. 12(*b*).

Subsequently, the transparent conductive film 23 is patterned by using a fourth photo mask. In such a manner, a first pixel electrode 23*a* and a second pixel electrode are formed as illustrated in FIG. 8, and a first auxiliary capacitor 6*c* and a second auxiliary capacitor are formed with the first pixel electrode 23*a* and the second pixel electrode contacting the semiconductor layer 13*d*.

In the foregoing manner, the TFT substrate 30*b* can be manufactured.

As described above, in the TFT substrate 30*b* and the manufacturing method thereof according to the present embodiment, since the semiconductor layer 13*d* made of the oxide semiconductor contacts, as in the first embodiment, the first pixel electrode 23*a* and the second pixel electrode made of the oxide conductor, a change in electrical capacitance of the first auxiliary capacitor 6*c* and the second auxiliary capacitor due to the semiconductor layer 13*d* can be reduced.

Third Embodiment of the Invention

Figure 13:
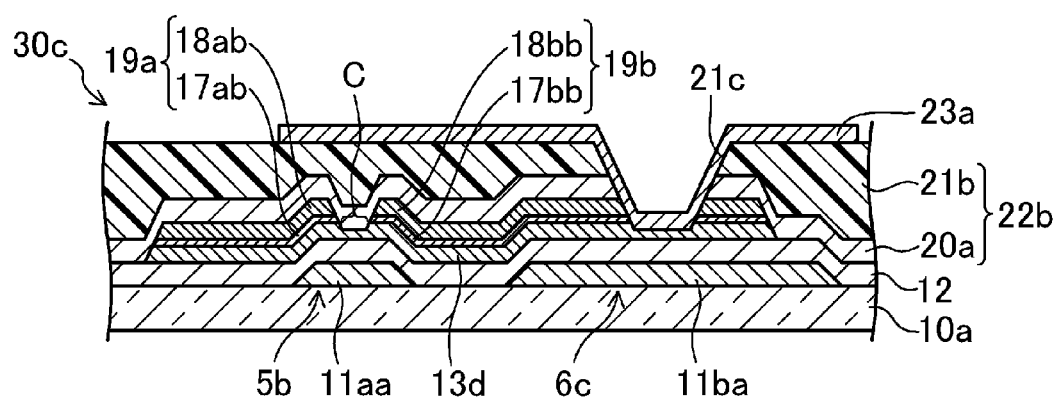
FIG. 13 is a cross-sectional view illustrating a TFT substrate of a third embodiment.

FIG. 13 is a cross-sectional view of a TFT substrate 30*c* of the present embodiment.

In the second embodiment, the TFT substrate 30*b* in which the second interlayer insulating film forming the interlayer insulating film is formed with no color has been described. On the other hand, in the present embodiment, the TFT substrate 30*c* having a color-filter-on-array structure in which a second interlayer insulating film forming an interlayer insulating film is colored will be described as an example.

In the TFT substrate 30*c*, a second interlayer insulating film 21*b* forming an upper part of an interlayer insulating film 22*b* is colored red, green, or blue. The other configuration of the TFT substrate 30*c* is substantially identical to that of the TFT substrate 30*b* of the second embodiment.

The TFT substrate 30c can be manufactured in such a manner that light exposure and development of a photosensitive resin film colored red, green, or blue is, for each of the three colors, repeated in the interlayer insulating film formation step of the manufacturing method of the second embodiment. Note that a counter substrate arranged so as to face the TFT substrate 30c has no color filter configuration.

As described above, in the TFT substrate 30c and a manufacturing method thereof according to the present embodiment, since a semiconductor layer 13d made of an oxide semiconductor contacts, as in each of the foregoing embodiments, a first pixel electrode 23a and a second pixel electrode made of an oxide conductor, a change in electrical capacitance of a first auxiliary capacitor 6c and a second auxiliary capacitor due to the semiconductor layer 13d can be reduced.

In each of the foregoing embodiments, the TFT substrate having the multi-pixel structure has been described as an example. However, the present invention is applicable to a TFT substrate having a single pixel structure.

In each of the foregoing embodiments, the In—Ga—Zn—O based oxide semiconductor has been described as an example of the semiconductor layer. However, the present invention is applicable to, e.g., the following oxide semiconductors: an In—Si—Zn—O based oxide semiconductor; an In—Al—Zn—O based oxide semiconductor; a Sn—Si—Zn—O based oxide semiconductor; a Sn—Al—Zn—O based oxide semiconductor; a Sn—Ga—Zn—O based oxide semiconductor; a Ga—Si—Zn—O based oxide semiconductor; a Ga—Al—Zn—O based oxide semiconductor; an In—Cu—Zn—O based oxide semiconductor; a Sn—Cu—Zn—O based oxide semiconductor; a Zn—O based oxide semiconductor; an In—O based oxide semiconductor; and an In—Zn—O based oxide semiconductor.

In each of the foregoing embodiments, the gate line, the gate electrode, and the first and second capacitor lines each having the single layer structure have been described as examples. However, the gate line, the gate electrode, and the first and second capacitor lines may each have a multilayer structure.

In each of the foregoing embodiments, the gate insulating film having the multilayer structure has been described as an example. However, the gate insulating film may have a single layer structure.

In each of the foregoing embodiments, the TFT substrate manufacturing method in which only four photo masks are used because of the reflow of the resist pattern has been described as an example. However, the present invention is applicable to a TFT substrate manufacturing method in which only four masks are used because a photosensitive resin film is exposed to light through a halftone or gray-tone mask to form a resist pattern.

In each of the foregoing embodiments, the TFT substrate manufacturing method in which the resist pattern is reflowed by heating has been described as an example. However, the present invention is applicable to a TFT substrate manufacturing method in which a resist pattern is reflowed by treatment (e.g., atmosphere treatment, mist treatment, and local application using an inkjet) using a solvent.

In each of the foregoing embodiments, the TFT substrate in which the electrode of the TFT connected to the pixel electrode serves as the drain electrode has been described as an example. However, the present invention is applicable to a TFT substrate in which an electrode of a TFT connected to a pixel electrode serves as a source electrode.

INDUSTRIAL APPLICABILITY

As described above, according to the present invention, the change in electrical capacitance of the auxiliary capacitor due to the semiconductor layer can be reduced. Thus, the present invention is useful for the TFT substrate forming the liquid crystal display panel.

DESCRIPTION OF REFERENCE CHARACTERS

C Channel Region
Raa, Rab, Rba, Rbb Resist Pattern
5a, 5b TFT
6a, 6c First Auxiliary Capacitor
6b Second Auxiliary Capacitor
11as Gate Electrode
11ba First Capacitor Line
11bb Second Capacitor Line
12 Gate Insulating Film
13 Semiconductor Film
13b, 13d Semiconductor Layer
14, 19 Metal Conductive Film
14aa, 19a Source Electrode
14ba, 19b First Drain Electrode
14bb Second Drain Electrode
15a, 22a, 22b Interlayer Insulating Film
15ca, 15cb, 21c Contact Hole
16a, 23 a First Pixel Electrode
16b Second Pixel Electrode
30a-30c TFT Substrate
40 Counter Substrate
45 Liquid Crystal Layer
50 Liquid Crystal Display Panel

The invention claimed is:

1. A method for manufacturing a thin film transistor substrate including
  a plurality of pixel electrodes provided in a matrix,
  a plurality of thin film transistors each provided for a corresponding one of the pixel electrodes and connected to the corresponding one of the pixel electrodes, and
  a plurality of auxiliary capacitors each provided for a corresponding one of the pixel electrodes,
  in which each of the thin film transistors includes
    a gate electrode provided on a substrate,
    a gate insulating film provided so as to cover the gate electrode,
    a semiconductor layer provided on the gate insulating film and having a channel region such that the channel region and the gate electrode overlap with each other, and
    source and drain electrodes provided on the semiconductor layer and arranged apart from each other with the channel region being interposed therebetween, the channel region being exposed through the source and drain electrodes, and
  each of the auxiliary capacitors includes
    a capacitor line made of a material identical to that of the gate electrode and provided in a layer identical to that of the gate electrode,
    the gate insulating film provided so as to cover the capacitor line,
    the semiconductor layer provided on the gate insulating film so as to overlap with the capacitor line, and
    the drain electrode provided on the semiconductor layer and connected to a corresponding one of the pixel electrodes, the method comprising:
  a gate layer formation step of forming the gate electrode and a capacitor line on a substrate;
  a resist pattern formation step of forming, after the gate insulating film, a semiconductor film made of an oxide semiconductor, and a metal conductive film are formed in this order so as to cover the gate electrode and the capacitor line, a resist pattern on a region of a metal conductive film where the source and drain electrodes are to be formed such that a region to be the channel region and part of a region overlapping with the capacitor line are exposed;

a first etching step of etching part of the metal conductive film exposed through the resist pattern to form the source and drain electrodes and the channel region and expose part of the semiconductor film through the drain electrode;

a second etching step of etching, after the resist pattern formed in the first etching step is reflowed and reformed so as to cover the part of the semiconductor film exposed through the drain electrode and the channel region, part of the semiconductor film exposed through the reformed resist pattern to form the semiconductor layer, thereby forming each of the thin film transistors;

an interlayer insulating film formation step of forming, after the resist pattern used in the second etching step is removed, an interlayer insulating film in which a contact hole is formed so as to reach part of the semiconductor layer exposed through the drain electrode in a region overlapping with the capacitor line; and a pixel electrode formation step of forming each of the pixel electrodes made of an oxide conductor on the interlayer insulating film to form each of the auxiliary capacitors with each of the pixel electrodes contacting the semiconductor layer.

2. The method of claim 1, wherein
the semiconductor film is made of an In—Ga—Zn—O based semiconductor.

* * * * *